(12) United States Patent
Tan et al.

(10) Patent No.: US 9,595,453 B2
(45) Date of Patent: Mar. 14, 2017

(54) CHIP PACKAGE METHOD AND PACKAGE ASSEMBLY

(71) Applicant: Silergy Semiconductor Technology (Hangzhou) Ltd., Hangzhou (CN)

(72) Inventors: Xiaochun Tan, Hangzhou (CN); Jiaming Ye, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 0 days.

(21) Appl. No.: 15/179,284

(22) Filed: Jun. 10, 2016

(65) Prior Publication Data

US 2016/0365257 A1  Dec. 15, 2016

(30) Foreign Application Priority Data

Jun. 11, 2015  (CN) .......................... 2015 1 0317651

(51) Int. Cl.
| | |
|---|---|
| H01L 21/00 | (2006.01) |
| H01L 21/48 | (2006.01) |
| H01L 21/56 | (2006.01) |
| H01L 23/495 | (2006.01) |
| H01L 23/31 | (2006.01) |

(52) U.S. Cl.
CPC ...... *H01L 21/4832* (2013.01); *H01L 21/4825* (2013.01); *H01L 21/4842* (2013.01); *H01L 21/565* (2013.01); *H01L 23/3114* (2013.01); *H01L 23/4952* (2013.01); *H01L 23/49541* (2013.01); *H01L 23/49582* (2013.01)

(58) Field of Classification Search
CPC . H01L 21/565; H01L 21/568; H01L 21/4825; H01L 21/4832; H01L 21/4842; H01L 23/3114; H01L 23/3121; H01L 23/3171; H01L 23/4952; H01L 23/49582
USPC .................................................. 438/123–127
See application file for complete search history.

(56) References Cited

U.S. PATENT DOCUMENTS

| | | | |
|---|---|---|---|
| 9,136,248 B2 | 9/2015 | Tan | |
| 9,324,633 B2 | 4/2016 | Tan | |
| 2004/0060174 A1* | 4/2004 | Imafuji | ............... H01L 21/4857 29/831 |
| 2008/0258279 A1* | 10/2008 | Lin | ..................... H01L 21/4842 257/676 |

(Continued)

FOREIGN PATENT DOCUMENTS

| | | |
|---|---|---|
| CN | 103545297 A | 1/2014 |
| CN | 103633058 A | 3/2014 |

(Continued)

*Primary Examiner* — Brook Kebede
(74) *Attorney, Agent, or Firm* — Westman, Champlin & Koehler, P.A.

(57) ABSTRACT

The present disclosure relates to a chip package method and a package assembly. A metal plate is micro-etched to form trenches having a predetermined depth. A metallic conductor is formed as a leadframe by filling the trenches with a material having relatively small adhesion with the metal plate. In such manner, the metal plate can be peeled off from a package body after the chip is electrically coupled to the metallic conductor and encapsulated by a molding process. A bottom of the metallic conductor is exposed from the package body. A chip package is thus completed. It simplifies a manufacture process for forming a chip package, reduces manufacture cost, and increases reliability of the chip package.

10 Claims, 1 Drawing Sheet

(56) References Cited

U.S. PATENT DOCUMENTS

2015/0171064 A1 6/2015 Tan
2016/0113144 A1 4/2016 Ye et al.

FOREIGN PATENT DOCUMENTS

| CN | 103700639 A | 4/2014 |
| CN | 104269385 A | 1/2015 |
| CN | 104409369 A | 3/2015 |

* cited by examiner

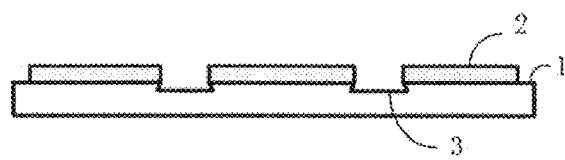
FIG. 1a
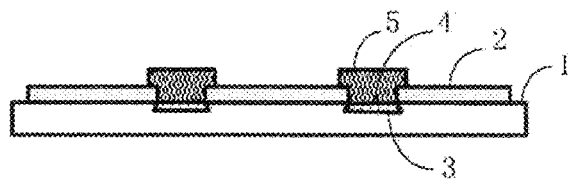
FIG. 1b
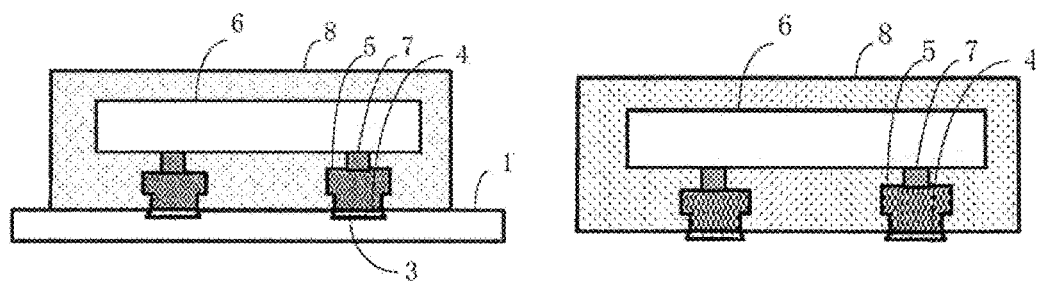
FIG. 1c
FIG. 1d
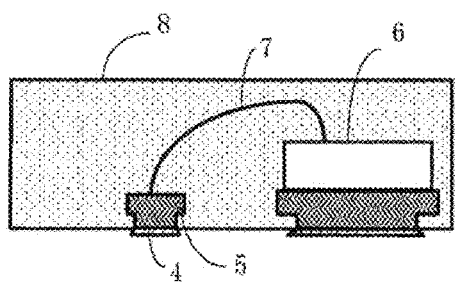
FIG. 2

CHIP PACKAGE METHOD AND PACKAGE ASSEMBLY

CROSS-REFERENCE TO RELATED APPLICATION

This application claims the benefit of Chinese Patent Application No. 201510317651.8, filed on Jun. 11, 2015, which is incorporated herein by reference in its entirety.

BACKGROUND OF THE DISCLOSURE

Field of the Disclosure

The present disclosure generally relates to the field of a chip package, and more particularly, to a chip package method and a package assembly.

Background of the Disclosure

A package assembly is formed by electrically coupling electrode terminals of a semiconductor die to a leadframe by conductive bumps or bonding wires, and then being encapsulated by a molding process so that leads of the leadframe are exposed from the package body for electric connection with an external circuit.

The leadframe may be preformed and directly used in a package process. However, the preformed leadframe is not flexible for various package wirings. There is a conventional technology in which a leadframe is formed in a package process and compatible with subsequent steps. The conventional approach of forming a leadframe in a package process includes forming a patterned layer as a leadframe, by depositing or electroplating on a package substrate, filling gaps between leads of the leadframe with a molding compound so that individual leads are secured by the molding compound, chemically etching a major portion of the package substrate at its bottom, and then turning upside down the package body and mounting a chip on an opposite surface and drawing out electrode terminals. However, the above approach of forming a leadframe in a package process includes the step of chemically etching the package substrate after forming the leadframe and the step of turning upside down the package body, which introduces difficulty and complexity in the manufacture process and causes poor property of the package assembly.

SUMMARY OF THE DISCLOSURE

In view of this, the present disclosure provides a chip package method and a package assembly which decreases steps of a package process, reduces manufacture cost and increases reliability of the package assembly.

There is provided a chip package method, comprising:

etching a metal plate to form at least one trench at a surface of the metal plate;

forming a metallic conductor at the at least one trench by electroplating, with a bottom of the metallic conductor being located in the at least one trench;

placing a chip on the metallic conductor and electrically coupling electrode terminals of the chip to the metallic conductor by electric connectors;

encapsulating the chip, the metallic conductor and the electric connectors by a molding process to form a package body, with the metal plate being exposed from the package body;

peeling off the metal plate from the package body to separate the metal plate from the metallic conductor and expose a bottom of the metallic conductor from the package body;

wherein the at least one trench has a predetermined depth so that the at least one trench locks the metallic conductor before the metal plate is peeled off from the package body, and the metallic conductor is separated from the at least one trench when the metal plate is peeled off from the package body.

Preferably, the step of forming the metallic conductor at the at least one trench by electroplating comprises:

forming a first metal layer in the at one trench by electroplating through an electroplating mask layer; and forming a second metal layer on the first metal layer by electroplating, wherein the first metal layer and the second metal layer constitute the metallic conductor.

Preferably, the step of forming the at least one trench comprises:

forming a photoresist pattern on the metal plate; and etching through openings in the photoresist pattern to form the at least one trench, wherein the photoresist pattern is used as the electroplating mask layer and is removed after the second metal layer is formed.

Preferably, the second metal layer is formed by electroplating such that the second metal layer has a bottom cross sectional area larger than a top cross sectional area.

Preferably, the metal plate comprises a chemical element of a first group and the metallic conductor comprises a chemical element of a second group which is different from the first group, so that adhesion between the metal plate and the metallic conductor is smaller than a predetermined value.

Preferably, the metal plate comprises iron as a first chemical element, the first metal layer comprises gold as a second chemical element, and the second metal layer comprises nickel as a third chemical element.

Preferably, the at least one trench has a depth between 0 micrometer and 5 micrometers.

Preferably, the electric connectors are conductive bumps or bonding wires.

Preferably, the metal plate is peeled off from the package body by a mechanical method.

There is also provided a package assembly formed by the above chip package method.

To sum up, the present disclosure relates to a chip package method. A metal plate is micro-etched to form trenches having a predetermined depth. A metallic conductor is formed as a leadframe by filling the trenches with a material having relatively small adhesion with the metal plate. In such manner, the metal plate can be peeled off from a package body after the chip is electrically coupled to the metallic conductor and encapsulated by the a molding process. A bottom of the metallic conductor is exposed from the package body. A chip package is thus completed. It simplifies a manufacture process for forming a chip package, reduces manufacture cost, and increases reliability of the chip package.

BRIEF DESCRIPTION OF THE DRAWINGS

FIGS. 1a to 1d are cross sectional views of structures at various steps of a chip package method according to an embodiment of the present disclosure; and FIG. 2 is a schematic diagram showing a structure of a chip package assembly according to an embodiment of the present disclosure.

DETAILED DESCRIPTION OF THE DISCLOSURE

Exemplary embodiments of the present disclosure will be described in more details below with reference to the accompanying drawings. In the drawings, like reference numerals denote like members. The figures are not drawn to scale, for the sake of clarity. Moreover, some well known parts may not be shown. For simplicity, the package structure having been subject to several relevant process steps may be shown in one figure. Some particular details of the disclosure will be described, such as an exemplary structure, material, dimension, process step and fabricating method of the device, for a better understanding of the present disclosure. However, it can be understood by one skilled person in the art that these details are not always essential for but can be varied in a specific implementation of the disclosure.

A chip package method according to an embodiment of the present disclosure includes the following steps.

At step a, a metal plate is etched to form at least one trench at a surface of the metal plate.

At step b, a metallic conductor is formed at the at least one trench by electroplating, with a bottom of the metallic conductor being located in the at least one trench.

At step c, a chip is placed on the metallic conductor, and electrode terminals of the chip are electrically coupled to the metallic conductor by electric connectors.

At step d, the chip, the metallic conductor and the electric connectors are encapsulated by a molding process to form a package body, with the metal plate being exposed from the package body.

At step e, the metal plate is peeled off from the package body to separate the metal plate from the metallic conductor and a bottom of the metallic conductor is exposed from the package body, for providing electric connection with an external circuit.

The at least one trench is formed to have a predetermined depth so that the at least one trench locks the metallic conductor before the metal plate is peeled off from the package body, and the metallic conductor can be separated from the at least one trench when the metal plate is peeled off from the package body.

FIGS. 1a to 1d are cross sectional views of structures at various steps of a chip package method according to an embodiment of the present disclosure. The chip package method according to an embodiment of the present disclosure will be described in more details below with reference to the accompanying drawings.

As shown in FIG. 1a, at step a, the step of forming trenches includes: applying a layer 2 of photoresist on a metal plate 1, patterning the layer 2 of photoresist to expose portions of a surface of the metal plate 1, and etching the metal plate 1 at the exposed portions of the surface of metal plate 1. The etching is controlled to reach a predetermined depth by adjusting concentration of an etchant solution and an etching rate, so that the trenches 3 are formed to have the predetermined depth at the surface of the metal plate 1. The trenches 3 may be controlled to have a depth between 0 micrometer and 6 micrometers, for example, 3 micrometers, 5 micrometers, or the like. Thus, such an etching method of forming trenches may be implemented as a micro-etching process. The trenches are formed by a micro-etching process such that the metal layer to be formed in subsequent steps is on one hand temporarily locked in the trenches, and is on the other hand finally separated from the trenches by peeling, for example by a mechanical method. The etching may also be controlled to have a bottom area larger than a top area so that the trenches having a small depth can also lock the metal layer formed above.

Further referring to FIG. 1b, the step b further includes: forming a first metal layer 4 by electroplating in the trenches, and forming a second metal layer 5 on the first metal layer 4 by electroplating, through an electroplating mask. The first metal layer 4 and the second metal layer 5 constitue the metallic conductor, with the first metal layer 4 as a bottom of the metallic conductor.

Here, the layer 2 of photoresist is used for forming the trenches 3 and is still kept, instead of being removed, after forming the trenches 3, so that the number of photolithograph processes can be decreased. At step b, the layer 2 of photoresist is further used as an electroplating mask, and is removed after forming the second metal layer 5. Specifically, the layer 2 of photoresist may be removed by peeling. An area of electroplating may be larger than a top area of the trenches when the second metal layer is formed, so that the second metal layer thus formed has a bottom cross sectional area smaller than a top cross sectional area. The metallic conductor has a structure with a bottom cross sectional area smaller than a top cross sectional area, which facilitates engagement between the metallic conductor and an encapsulant in subsequent steps and increases reliability of the chip package.

Specifically, in order that the metal plate is separated from a bottom of the metallic conductor while the metal plate is separated from the package body, the metal plate comprises a chemical element of a first group and the metallic conductor comprises a chemical element of a second group which is different from the first group, so that adhesion between the metal plate and the metallic conductor is smaller than a predetermined value. The predetermined value is a suitable value such that the bottom of the metallic conductor can be peeled off from the metal plate by a mechanical method. For example, the metal plate comprises iron as a first chemical element, the first metal layer comprises gold as a second chemical element, and the second metal layer comprises nickel as a third chemical element.

As shown in FIG. 1c, the step of electrically coupling the electric connectors to the metallic conductor includes: placing a chip 6 on the metallic conductor with an active surface facing towards the metallic conductor, and electrically coupling electrode terminals on the active surface to the metallic conductor by electric connectors 7, so that the chip 6 is formed as a package in a flip-chip manner. Here, the electric connectors 7 are conductive bumps, for example, copper posts. After the chip 6 is mounted on the metallic conductor, the chip 6, the metallic conductor and the electric connectors 7 are encapsulated by a molding compound in a molding process to form a package body 8, with the metal plate 1 being exposed from the package body 8. After the encapsulation, the metal plate is peeled off from the package body 8, for example, by a mechanical method. Meanwhile, a bottom of the metallic conductor, i.e. the first metal layer 4, is also separated from the trenches 3, so as to separate the metallic conductor from the metal plate. After peeling off the metal plate 1, the package assembly is formed, as shown in FIG. 1d. The bottom of the metallic conductor is exposed from the package body 8, for providing electric connection between electrode terminals and an external circuit.

In an alternative embodiment, the electric connectors 7 may be bonding wires, as shown in FIG. 2. The metallic conductor in this embodiment may have a first portion with a relatively large area for supporting the chip 6, and may have a second portion with a relatively small area around the first portion. The second portion of the metallic conductor with a relatively small area is used as a lead for drawing out the electrode terminals. The specific package process includes: attaching a non-active surface of the chip to the first portion of the metallic conductor with a relatively large area, electrically coupling electrode terminals on the active surface to the second portion of the metal conductor with a relatively small area by using bonding wires, encapsulating in a molding process, and peeling off the metal plate. Thus, the package assembly is formed as shown in FIG. 2.

Moreover, the present disclosure provides a package assembly formed by the chip package method according to the above embodiments. The package assembly has a structure shown in FIG. 1*d* and FIG. 2.

To sum up, the present disclosure relates to a chip package method. A metal plate is micro-etched to form trenches having a predetermined depth. A metallic conductor is formed as a leadframe by filling the trenches with a material having relatively small adhesion with the metal plate. In such manner, the metal plate can be peeled off from an encapsulant after the chip is electrically coupled to the metallic conductor and encapsulated by the a molding process. A bottom of the metallic conductor is exposed from the encapsulant. A chip package is thus completed. It simplifies a manufacture process for forming a chip package, reduces manufacture cost, and increases reliability of the chip package.

Although various embodiments of the present disclosure are described above, these embodiments neither present all details, nor imply that the present disclosure is limited to these embodiments. Obviously, many modifications and changes may be made in light of the teaching of the above embodiments. These embodiments are presented and some details are described herein only for explaining the principle of the disclosure and its actual use, so that one skilled person can practice the present disclosure and introduce some modifications in light of the disclosure. The disclosure is intended to cover alternatives, modifications and equivalents that may be included within the spirit and scope of the disclosure as defined by the appended claims.

The invention claimed is:

1. A chip package method, comprising:
   etching a metal plate to form at least one trench at a surface of said metal plate;
   forming a metallic conductor at said at least one trench by electroplating, with a bottom of said metallic conductor being located in said at least one trench;
   placing a chip on said metallic conductor and electrically coupling electrode terminals of said chip to said metallic conductor by electric connectors;
   encapsulating said chip, said metallic conductor and said electric connectors by a molding process to form a package body, with said metal plate being exposed from said package body; and
   peeling off said metal plate from said package body to separate said metal plate from said metallic conductor and expose a bottom of said metallic conductor from said package body,
   wherein said at least one trench has a predetermined depth so that said at least one trench locks said metallic conductor before said metal plate is peeled off from said package body, and said metallic conductor is separated from said at least one trench when said metal plate is peeled off from said package body.

2. The chip package method according to claim 1, wherein said step of forming said metallic conductor at said at least one trench by electroplating comprises:
   forming a first metal layer in said one trench by electroplating through an electroplating mask; and
   forming a second metal layer on said first metal layer by electroplating,
   wherein said first metal layer and said second metal layer constitute said metallic conductor.

3. The chip package method according to claim 2, wherein said step of forming said at least one trench comprises:
   forming a photoresist pattern on said metal plate; and
   etching through openings in said photoresist pattern to form said at least one trench,
   wherein said photoresist pattern is used as said electroplating mask, and is removed after said second metal layer is formed.

4. The chip package method according to claim 3, wherein said second metal layer is formed by electroplating such that said second metal layer has a bottom cross sectional area larger than a top cross sectional area.

5. The chip package method according to claim 3, wherein said metal plate comprises a chemical element of a first group and said metallic conductor comprises a chemical element of a second group which is different from said first group, so that adhesion between said metal plate and said metallic conductor is smaller than a predetermined value.

6. The chip package method according to claim 5, wherein said metal plate comprises iron as a first chemical element, said first metal layer comprises gold as a second chemical element, and said second metal layer comprises nickel as a third chemical element.

7. The chip package method according to claim 3, wherein said at least one trench has a depth between 0 micrometer and 5 micrometers.

8. The chip package method according to claim 3, wherein said electric connectors are conductive bumps or bonding wires.

9. The chip package method according to claim 3, wherein said metal plate is peeled off from said package body by a mechanical method.

10. A package assembly formed by said chip package method comprising:
    etching a metal plate to form at least one trench at a surface of said metal plate;
    forming a metallic conductor at said at least one trench by electroplating, with a bottom of said metallic conductor being located in said at least one trench;
    placing a chip on said metallic conductor and electrically coupling electrode terminals of said chip to said metallic conductor by electric connectors;
    encapsulating said chip, said metallic conductor and said electric connectors by a molding process to form a package body, with said metal plate being exposed from said package body; and
    peeling off said metal plate from said package body to separate said metal plate from said metallic conductor and expose a bottom of said metallic conductor from said package body,
    wherein said at least one trench has a predetermined depth so that said at least one trench locks said metallic conductor before said metal plate is peeled off from said package body, and said metallic conductor is separated from said at least one trench when said metal plate is peeled off from said package body.

* * * * *